(12) United States Patent
Song et al.

(10) Patent No.: US 10,476,316 B2
(45) Date of Patent: Nov. 12, 2019

(54) WIRELESS CHARGING BOARD AND WIRELESS CHARGING DEVICE

(71) Applicant: LG INNOTEK CO., LTD., Seoul (KR)

(72) Inventors: Ji Yeon Song, Seoul (KR); Seok Bae, Seoul (KR); Soon Young Hyun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 487 days.

(21) Appl. No.: 15/113,385

(22) PCT Filed: Jan. 21, 2015

(86) PCT No.: PCT/KR2015/000596
§ 371 (c)(1),
(2) Date: Jul. 21, 2016

(87) PCT Pub. No.: WO2015/111903
PCT Pub. Date: Jul. 30, 2015

(65) Prior Publication Data
US 2017/0012458 A1  Jan. 12, 2017

(30) Foreign Application Priority Data

Jan. 22, 2014 (KR) ........................ 10-2014-0007909

(51) Int. Cl.
*H02J 50/10* (2016.01)
*H02J 50/70* (2016.01)
*H05K 1/16* (2006.01)
*H02J 7/02* (2016.01)
*H01F 27/28* (2006.01)
(Continued)

(52) U.S. Cl.
CPC .......... *H02J 50/70* (2016.02); *H01F 27/2804* (2013.01); *H01F 27/288* (2013.01); *H01F 27/402* (2013.01); *H01F 38/14* (2013.01); *H02J 7/025* (2013.01); *H02J 50/10* (2016.02); *H05K 1/165* (2013.01); *H05K 2201/086* (2013.01)

(58) Field of Classification Search
CPC .................................. H02J 50/10; H02J 50/12
See application file for complete search history.

(56) References Cited

U.S. PATENT DOCUMENTS

| | | | |
|---|---|---|---|
| 2010/0181842 A1* | 7/2010 | Suzuki | H02J 50/10 |
| | | | 307/104 |
| 2013/0099589 A1 | 4/2013 | An | |
| 2013/0300352 A1 | 11/2013 | Kuk et al. | |

FOREIGN PATENT DOCUMENTS

| | | |
|---|---|---|
| CN | 103151847 A | 6/2013 |
| JP | 2012-222926 A | 11/2012 |
| KR | 10-2010-0130480 A | 12/2010 |

(Continued)

OTHER PUBLICATIONS

EPO Machine translations for KR1020130010797 and KR1020130019520, printed Mar. 18, 2019.*

*Primary Examiner* — Fritz M Fleming
(74) *Attorney, Agent, or Firm* — Birch, Stewart, Kolasch & Birch, LLP

(57) ABSTRACT

Provided are a wireless charging board and a wireless charging device. The wireless charging board includes: a shielding layer; a coil pattern disposed on one surface of the shielding layer; and a magnetic pattern disposed in a space of a central part of the coil pattern.

13 Claims, 2 Drawing Sheets

(51) Int. Cl.
*H01F 27/40* (2006.01)
*H01F 38/14* (2006.01)

(56) References Cited

FOREIGN PATENT DOCUMENTS

| KR | 10-2011-0133813 A | 12/2011 |
| KR | 10-2012-0100217 A | 9/2012 |
| KR | 10-1209979 B1 | 12/2012 |
| KR | 10-2013-0010797 A | 1/2013 |
| KR | 10-2013-0019520 A | 2/2013 |

* cited by examiner

WIRELESS CHARGING BOARD AND WIRELESS CHARGING DEVICE

CROSS REFERENCE TO RELATED APPLICATIONS

This application is the National Phase of PCT International Application No. PCT/KR2015/000596, filed on Jan. 21, 2015, which claims priority under 35 U.S.C. 119(a) to Patent Application No. 10-2014-0007909, filed in the Republic of Korea on Jan. 22, 2014, all of which are hereby expressly incorporated by reference into the present application.

TECHNICAL FIELD

Embodiments of the present invention relate to a wireless charging board and a wireless charging device.

BACKGROUND ART

Wireless power conversion (WPC) is a non-contact charging technology which is a wireless charging technology in which a battery is charged using magnetic coupling without electrical contact at a short distance.

According to transmission standards of WPC, a technique by which predetermined signals are periodically transmitted from a transmitter to a receiver to detect whether the receiver is located in an area which the transmitter can reach, is used. A battery can be charged using magnetic coupling without an additional electrical contact in WPC, and as such WPC can be applied to battery charging in various fields.

Meanwhile, a hall sensor is mounted on a transmitter that transmits power in transmission standards for power matters alliance (PMA), and the hall sensor detects the instant that a receiver is located in an area which the transmitter can reach, such that a consumption of standby power is small.

In such a WPC or PMA technique, a magnetic field is formed by alternating current (AC) power energy generated in a primary coil, current flows through a coil of an antenna, and a voltage is generated due to an inductance of the antenna. The voltage generated in this way is used as power for data transmission or to charge a battery.

However, in the PMA technique, in order for the hall sensor of the transmitter to detect the receiver, a difference of a predetermined gauss or more has to be generated when the receiver is located in an area which the transmitter can reach, and a voltage difference of a predetermined voltage or more has to be generated when the receiver is not located in an area which the transmitter can reach.

Such a voltage difference is mostly affected by a thickness of a shielding material of the receiver. In order to form a voltage difference of a predetermined voltage or more, the thickness of the shielding material has to be large. Thus, material costs increase and it becomes difficult to embed the receiver in a portable mobile terminal device due to the thickness of the shielding material.

DISCLOSURE

Technical Problem

The present invention is directed to further improving wireless charging efficiency while reducing a thickness of a shielding layer through a configuration including a magnetic pattern disposed in a space of a central part of a coil pattern.

Technical Solution

One aspect of the present invention provides a wireless charging board including: a shielding layer; a coil pattern disposed on one surface of the shielding layer; and a magnetic pattern disposed in a space of a central part of the coil pattern.

According to another embodiment of the present invention, the magnetic pattern may be disposed on the same plane as the coil pattern.

According to another embodiment of the present invention, a thickness of the magnetic pattern may be equal to or less than a thickness of the coil pattern.

According to another embodiment of the present invention, an area of the magnetic pattern may be 2% to 40% of an area of the one surface of the shielding layer.

According to another embodiment of the present invention, a relative permeability of the magnetic pattern may be 10 to 100000.

According to another embodiment of the present invention, a magnetic flux density of the magnetic pattern may be 0.4 to 2.5 Tesla (T).

According to another embodiment of the present invention, the magnetic pattern may be formed of iron (Fe)-based non-directional electrical steel, Fe-based directional electrical steel, or stainless steel.

According to another embodiment of the present invention, a thickness of the shielding layer may be 1 to 600 μm.

According to another embodiment of the present invention, a relative permeability of the shielding layer may be 10 to 1000.

According to another embodiment of the present invention, the shielding layer may include a Fe-based magnetic material.

According to another embodiment of the present invention, the wireless charging board may further include an adhesive layer which attaches the coil pattern to the shielding layer.

Another aspect of the present invention provides a wireless charging device including: a wireless charging board including a first shielding layer, a first coil pattern disposed on one surface of the first shielding layer, and a magnetic pattern disposed in a space of a central part of the first coil pattern; and a charge inducing board including a second shielding layer and a second coil pattern disposed on one surface of the second shielding layer, and which induces an alternating current (AC) in the first coil pattern.

According to another embodiment of the present invention, the charge inducing board may be disposed to face the wireless charging board.

According to another embodiment of the present invention, the charge inducing board may further include a hall sensor which measures a change in a voltage difference in a central part of the second coil pattern.

Advantageous Effects

As described above, through a configuration including a magnetic pattern disposed in a space of a central part of a coil pattern, wireless charging efficiency can be further improved while reducing a thickness of a shielding layer. Because the thickness of the shield layer of a wireless charging device is not increased, requirements for embedding a wireless charging board or the wireless charging device in a portable mobile terminal device can be satisfied.

MODE OF THE INVENTION

Figure 1:
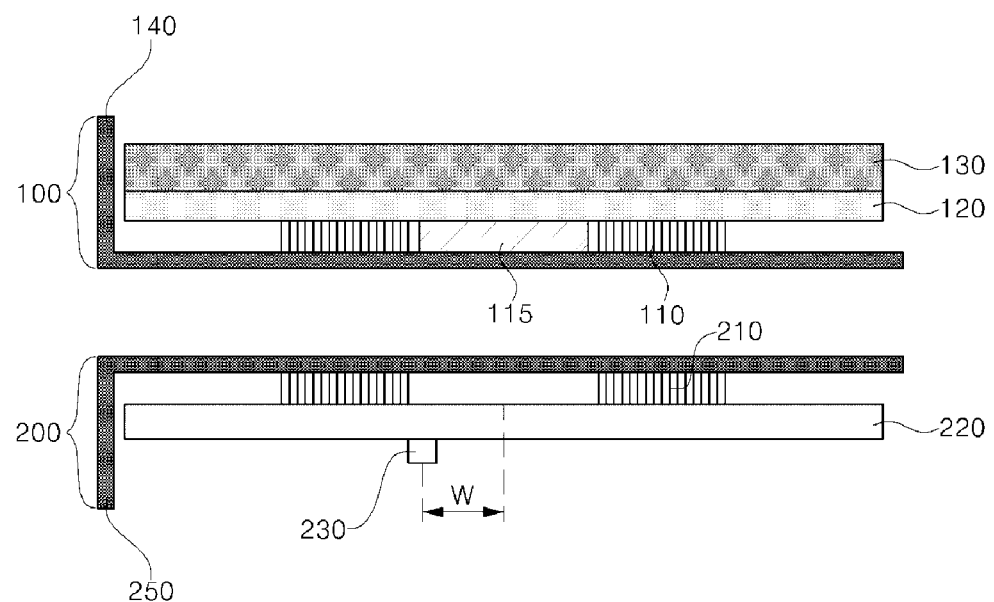
FIG. 1 is a cross-sectional view of a wireless charging device according to an embodiment of the present invention.

Hereinafter, exemplary embodiments of the present invention will be described in detail. However, if it is determined that a detailed description of well-known functions or configurations related to the invention unnecessarily obscures the subject matter of the invention in the description of embodiments, the detailed description will be omitted. Also, sizes of elements in the drawings may be exaggerated for explanation and do not refer to actually-applied sizes.

Figure 2:
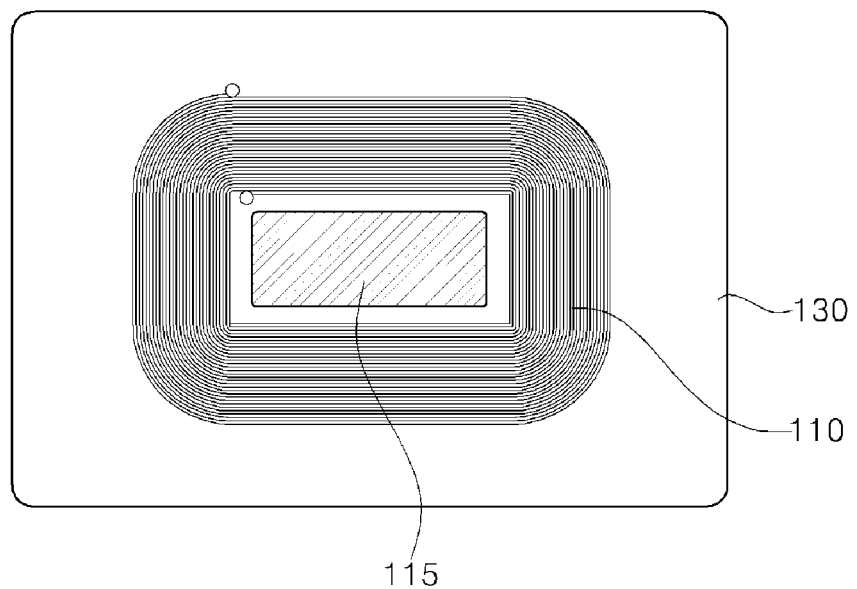
FIG. 2 is a top view of a wireless charging board according to an embodiment of the present invention.

FIG. 1 is a cross-sectional view of a wireless charging device according to an embodiment of the present invention, and FIG. 2 is a top view of a wireless charging board according to an embodiment of the present invention.

The wireless charging device according to an embodiment of the present invention and the wireless charging board according to an embodiment of the present invention will be described with reference to FIGS. 1 and 2.

As illustrated in FIG. 1, the wireless charging device according to an embodiment of the present invention includes a charge inducing board 200 and a wireless charging board 100.

Each of the charge inducing board 200 and the wireless charging board 100 includes first and second coil patterns 110 and 210. When power is supplied to the second coil pattern 210 of the charge inducing board 200 and an alternating current (AC) flows through the second coil pattern 210, an AC is induced in the first coil pattern 110 of the wireless charging board 100 that is physically spaced apart from the charge inducing board 200 due to electromagnetic induction.

Charging of a battery (not shown) can be performed using the AC induced in the wireless charging board 100.

Meanwhile, the charge inducing board 200 may be a transmission pad, and the wireless charging board 100 may be part of a portable mobile terminal device, a home/personal electronic product, a transportation unit, or the like to which a wireless power transmission/reception technology is applied. The portable mobile terminal device, the home/personal electronic product, the transportation unit, or the like to which the wireless power transmission/reception technology is applied may include only the wireless charging board 100 or both the charge inducing board 200 and the wireless charging board 100. A magnetic pattern 115 is included in the wireless charging board 100, and a voltage difference detected by a hall sensor 230 of the charge inducing board 200 may be equal to or greater than a predetermined voltage due to the inclusion of the magnetic pattern 115 in the wireless charging board 100. In this case, the voltage difference detected by the hall sensor 230 is a difference in voltages when the wireless charging board 100 is located in an area which the charge inducing board 200 can reach electrically, and when the wireless charging board 100 is not located in an area which the charge inducing board 200 can reach electrically, respectively.

The hall sensor 230 is included in the charge inducing board 200, and a separation distance w between the hall sensor 230 and a central part of a second shielding layer 220 of the charge inducing board 200 may be 1.5 mm. In this way, the hall sensor 230 is disposed close to the central part of the second shielding layer 220 so that a change in voltages in a central part of the charge inducing board 200 can be accurately measured.

Meanwhile, the charge inducing board 200 may include the second shielding layer 220 and the second coil pattern 210, which are disposed in a second housing 250.

In addition, the wireless charging board 100 is accommodated in a first housing 140. The wireless charging board 100 may include the first coil pattern 110 and a first shielding layer 130, and the first coil pattern 110 may be attached to the first shielding layer 130 by an adhesive layer 120.

The magnetic pattern 115 is disposed on the wireless charging board 100 having the above configuration.

In more detail, the first coil pattern 110 is disposed on one surface of the first shielding layer 130, and, as illustrated in FIG. 2, the magnetic pattern 115 is disposed in a space of a central part of the first coil pattern 110 on the same plane as the first coil pattern 110.

In addition, as illustrated in FIG. 2, the magnetic pattern 115 may be configured to have an area that is 2% to 40% of an area of the one surface of the first shielding layer 130. When the magnetic pattern 115 is configured to have an area corresponding to 2% or less of the area of the one surface of the first shielding layer 130, a problem in which a voltage difference detected by the hall sensor 230 is 120 mV or less, which is a reference voltage difference, may occur.

In this case, when the magnetic pattern 115 exceeds 40% of the area of the one surface of the first shielding layer 130, the magnetic pattern 115 is too large and an increase in a voltage difference is not significant when compared to an increase in material costs, which is not efficient.

Also, a thickness of the magnetic pattern 115 may be equal to or less than a thickness of the first coil pattern 110. This is because, when the magnetic pattern 115 exceeds the thickness of the first coil pattern 110, a problem in which the first coil pattern 110 is spaced apart from the first housing 140 due to the magnetic pattern 115 and stability is lowered may occur.

Meanwhile, the magnetic pattern 115 has a relative permeability of 10 to 100000, and the relative permeability of the magnetic pattern 115 may be greater than 10 to 1000, which is a relative permeability of the first shielding layer 130. Also, the magnetic pattern 115 may be configured to have a magnetic flux density of 0.4 to 2.5 Tesla (T).

In this way, since the relative permeability of the magnetic pattern 115 may be configured to be greater than the relative permeability of the first shielding layer 130 and to have the magnetic flux density of 0.4 to 2.5 T, a voltage difference can be further increased.

In addition, the magnetic pattern 115 may be formed of a material having a high saturation magnetization value. For example, the magnetic pattern 115 may be formed using electrical steel or stainless steel.

Meanwhile, the magnetic pattern 115 may be formed of iron (Fe)-based non-directional electrical steel or Fe-based directional electrical steel. Electrical steel refers to a soft magnetic material in which a crystal arrangement is adjusted in a direction that is vulnerable to magnetization of Fe, and silicon (Si) is added to the soft magnetic material to suppress a reduction in Fe loss. Stainless steel having a high saturation magnetization value is used to form the magnetic pattern 115.

Meanwhile, the first shielding layer 130 of the wireless charging board 100 may include an Fe-based magnetic material having a thickness of 1 to 600 μm.

As described above, since the thickness of the wireless charging board 100 is 1 to 600 μm, the wireless charging board 100 can be more easily embedded in a portable mobile terminal device.

Figure 3:
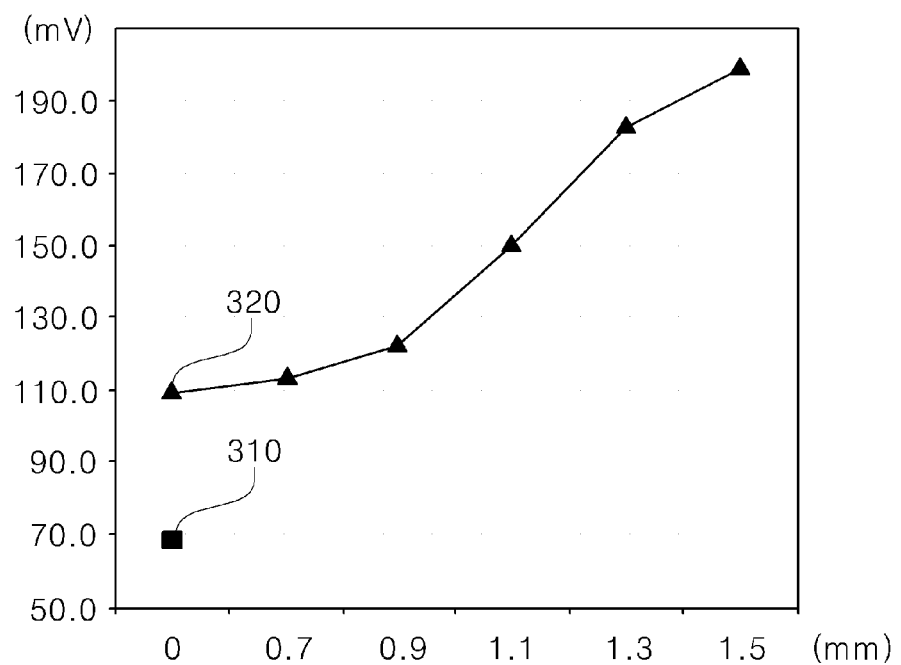
FIG. 3 is a graph for describing improvements in charging efficiency of a wireless charging board and a wireless charging device according to an embodiment of the present invention.

FIG. 3 is a graph for describing improvements in charging efficiency of a wireless charging board and a wireless charging device according to an embodiment of the present invention.

Charging efficiency of a wireless charging board according to an embodiment of the present invention and a wireless charging device according to an embodiment of the present invention will be described with reference to FIG. 3.

A horizontal axis of the graph of FIG. 3 represents a width of a magnetic pattern, and a vertical axis thereof represents a voltage difference.

In this case, the voltage difference is a difference in voltage values detected by the hall sensor 230 when a receiver is located in an area which a transmitter can reach electrically, and when the receiver is not located in an area which the transmitter can reach electrically, respectively. That is, the larger the voltage difference is, the higher charging efficiency is.

As shown in FIG. 3, a voltage difference detected by a hall sensor in the conventional art 310 is less than 70 mV when there is no magnetic pattern.

However, a voltage difference detected by a hall sensor in the present invention 320 gradually increases as the width of a magnetic pattern is increased.

In more detail, as the width of the magnetic pattern increases, an area of the magnetic pattern on a shielding layer increases so that a voltage difference is increased. When the width of the magnetic pattern is 0.9 mm or more, the voltage difference detected by the hall sensor 230 is 120 mV or more, which is a reference voltage.

For example, when the width of the magnetic pattern is 0.9 mm or the area of the magnetic pattern on the shielding layer is 2%, a voltage difference of 120 mV is generated. When the width of the magnetic pattern is 1.5 mm or the area of the magnetic pattern on the shielding layer is than 8% or more, a voltage difference of 200 mV is generated.

As described above, according to the present invention, through a configuration including a magnetic pattern disposed in a space of a central part of a coil pattern, wireless charging efficiency can be further improved while reducing a thickness of a shielding layer. Furthermore, according to the present invention, because a thickness of a shielding layer of a wireless charging device is not increased, requirements for embedding a wireless charging board or the wireless charging device in a portable mobile terminal device can be satisfied.

While the invention has been shown and described with reference to certain exemplary embodiments thereof, it should be understood by those skilled in the art that various changes in form and details may be made therein without departing from the spirit and scope of the invention as defined by the appended claims.

EXPLANATION OF REFERENCE NUMERALS

100: wireless charging board
110: first coil pattern
115: magnetic pattern
120: adhesion layer
130: first shielding layer
140: first housing
200: charge inducing board
210: second coil pattern
220: second shielding layer
230: hall sensor

The invention claimed is:

1. A wireless charging board comprising:
a shielding layer;
a coil pattern disposed on one surface of the shielding layer;
an adhesive layer interposed between the shielding layer and the coil pattern; and
a magnetic pattern disposed on the adhesive layer and entirely within a space of a central part of the coil pattern,
wherein the magnetic pattern is disposed on the same plane as the coil pattern,
wherein a thickness of the magnetic pattern is equal to or less than a thickness of the coil pattern,
wherein a relative permeability of the magnetic pattern is 10 to 100000,
wherein a relative permeability of the shielding layer is 10 to 1000, and
wherein a magnetic flux density of the magnetic pattern is 0.4 to 2.5 Tesla (T).

2. The wireless charging board of claim 1, wherein an area of the magnetic pattern is 2% to 40% of an area of the one surface of the shielding layer.

3. The wireless charging board of claim 1, wherein a width of the magnetic pattern is 0.9 to 1.5 mm.

4. The wireless charging board of claim 1, wherein the magnetic pattern is formed of iron (Fe)-based non-directional electrical steel, Fe-based directional electrical steel, or stainless steel.

5. The wireless charging board of claim 1, wherein a thickness of the shielding layer is 1 to 600 μm.

6. The wireless charging board of claim 1, wherein the shielding layer comprises an Fe-based magnetic material.

7. The wireless charging board of claim 1, wherein an interface between the coil pattern and the shielding layer is free of magnetic material.

8. The wireless charging board of claim 1, wherein an uppermost surface of the magnetic pattern does not extend past an uppermost surface of the coil pattern.

9. The wireless charging board of claim 1, wherein the magnetic pattern and an innermost coil winding of the coil pattern both have a rectangular shape.

10. The wireless charging board of claim 1, wherein an outermost coil winding of the coil pattern has a rounded rectangle shape.

11. The wireless charging board of claim 1, wherein the magnetic pattern is provided such that a voltage difference detected by a hall sensor of a charge inducing board is equal to or greater than a predetermined voltage, and
wherein the voltage difference being a difference in voltages when the wireless charging board is located in an area which the charge inducing board can reach electrically, and when the wireless charging board is not located in an area which the charge inducing board can reach electrically, respectively.

12. The wireless charging board of claim 11, wherein a change in the voltage difference detected by the hall sensor based on a distance between the wireless charging board and the charge inducing board is equal to or greater than a predetermined voltage of 120 mV.

13. The wireless charging board of claim 11, wherein a change in a voltage difference detected by the hall sensor based on a distance between the wireless charging board and the charge inducing board is equal to or less than 200 mV.

* * * * *